United States Patent
Aihara

(10) Patent No.: US 7,768,043 B2
(45) Date of Patent: Aug. 3, 2010

(54) SEMICONDUCTOR DEVICE HAVING HIGH FREQUENCY COMPONENTS AND MANUFACTURING METHOD THEREOF

(75) Inventor: Yasuki Aihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 127 days.

(21) Appl. No.: 11/487,503

(22) Filed: Jul. 17, 2006

(65) Prior Publication Data

US 2007/0123026 A1    May 31, 2007

(30) Foreign Application Priority Data

Nov. 28, 2005    (JP) .............................. 2005-342199

(51) Int. Cl.
*H01L 23/00* (2006.01)
*H01L 21/00* (2006.01)
(52) U.S. Cl. .............................. 257/276; 257/E23.013; 257/E21.499; 438/619
(58) Field of Classification Search .............. 257/213, 257/256, 272, 275, 276, E23.01–E23.014, 257/E21.499–E21.504; 438/584, 597, 618, 438/619
See application file for complete search history.

(56) References Cited

U.S. PATENT DOCUMENTS

| | | | | |
|---|---|---|---|---|
| 5,757,072 A | * | 5/1998 | Gorowitz et al. | 257/700 |
| 6,798,064 B1 | * | 9/2004 | Henry et al. | 257/750 |
| 6,830,958 B2 | | 12/2004 | Makimoto | |
| 7,342,351 B2 | * | 3/2008 | Kubo et al. | 310/344 |
| 2007/0013268 A1 | * | 1/2007 | Kubo et al. | 310/324 |

FOREIGN PATENT DOCUMENTS

| | | |
|---|---|---|
| JP | 05-335343 | 12/1993 |
| JP | 2003-273279 | 9/2003 |
| WO | WO 2004/105237 A1 * | 12/2004 |

OTHER PUBLICATIONS

K. Makiyama, et al. "Improvement of Circuit-Speed of HEMTs IC by reducing the parasitic capacitance." *International Electron Devices Meeting: Technical Digest*. Dec. 8-10, 2003. Washington, D.C. pp. IEDM 03-727-IEDM 03-730.

* cited by examiner

*Primary Examiner*—Sue Purvis
*Assistant Examiner*—Kevin Quinto
(74) *Attorney, Agent, or Firm*—Leydig, Voit & Mayer, Ltd.

(57) ABSTRACT

A transistor is located on a GaAs substrate. An air bridge extends to provide a cavity above gate electrodes of the transistor. An opening is sealed by the end ball of a second wire. Further, the semiconductor device is wholly covered by sealing resin.

5 Claims, 13 Drawing Sheets

SEMICONDUCTOR DEVICE HAVING HIGH FREQUENCY COMPONENTS AND MANUFACTURING METHOD THEREOF

BACKGROUND OF THE INVENTION

1. Field of the Invention

The present invention relates to a semiconductor device and a method for manufacturing the same. In particular, the invention relates to a semiconductor device that includes high frequency components and a method for manufacturing the same.

2. Background Art

Typically, semiconductor devices are separated as individual semiconductor chips. For example, in Japanese Unexamined Patent Publication No. 2003-273279, semiconductor chips mounted in packages and the like are disclosed.

In the case of a semiconductor device which uses a high frequency component such as a high electron mobility transistor (HEMT), parasitic capacitance deteriorates the performance. Therefore, it is particularly necessary to decrease the capacitance between the input and output of the high frequency signal. However, there has been a problem in that when a semiconductor device is mounted in a mold package or the like, high dielectric constant molding resin may be intruded into the active portion of the high frequency component, resulting in an increase in parasitic capacitance.

SUMMARY OF THE INVENTION

The present invention has been developed to solve the above-described problem, and therefore it is an object of the present invention to provide a semiconductor device and its manufacturing method to prevent high dielectric constant molding resin from penetrating into the active portion of a high frequency component so as to suppress an increase in parasitic capacitance.

The above object is achieved by a semiconductor device that includes a component formed on a substrate, a first wire of an air bridge structure extended above the substrate at a certain distance from the component, an insulation film which encloses a space between the first wire and an area where the component is formed on the substrate, and a sealing material which covers the first wire and the insulation film, and wherein, the first wire has openings and the openings are sealed by a second wire.

The above object is achieved by a method of manufacturing a semiconductor device that includes the steps of forming a component on a substrate, forming a first wire of an air bridge structure extended above the substrate at a certain distance from the component, forming openings in the first wire, forming an insulation film which encloses a space between the first wire and an area where the component is formed on the substrate, forming a second wire which seals the openings, and molding a sealing material which covers the first wire and the insulation film.

According to the present invention, it is possible to provide a high frequency component-used semiconductor device and its measuring method capable of preventing high dielectric constant molding resin from penetrating into the active portion of a high frequency component so as to suppress an increase in parasitic capacitance.

Other features and advantages of the invention will be apparent from the following description taken in connection with the accompanying drawings.

DETAILED DESCRIPTION OF THE PREFERRED EMBODIMENTS

Figure 1:
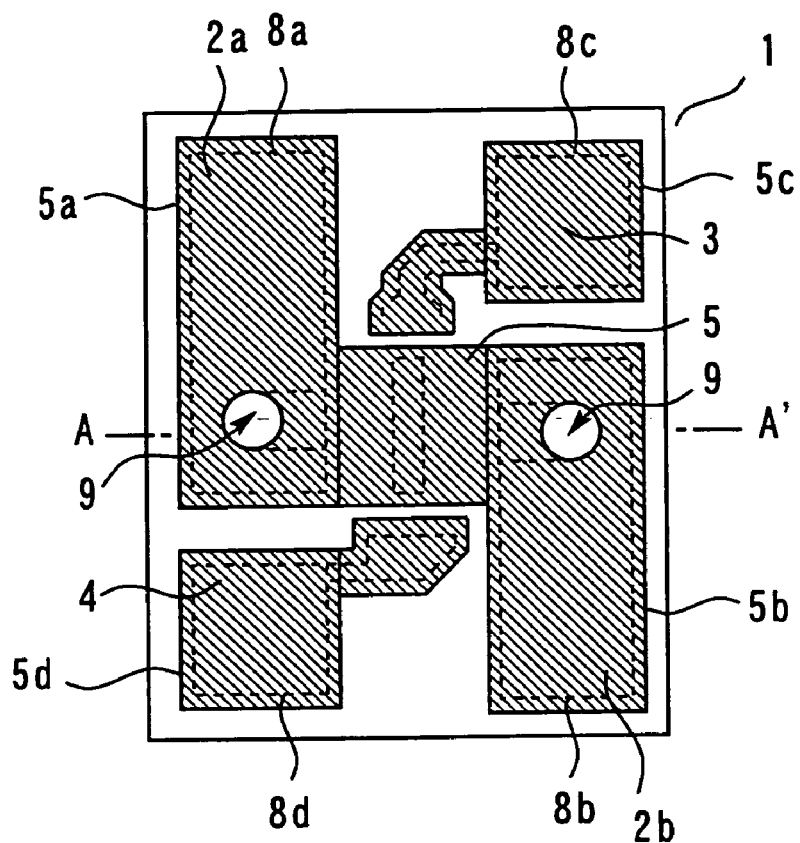
FIGS. 1 through 11 show a method of a manufacturing of a semiconductor device of the first embodiment.

Embodiments of the present invention will be described below referring to the drawings. In the drawings, the same or equivalent parts will be denoted by the same reference numerals, and the description thereof will be simplified or omitted.

First Embodiment

The following describes a method of manufacturing a semiconductor device in accordance with this embodiment. Firstly, as shown in FIG. 1, a component such as a high frequency transistor and electrodes such as bonding pads are formed on a GaAs substrate 1. Then, after an air bridge to connect electrodes is formed, openings are formed in the air bridge.

As shown in FIG. 1, source bonding pads 2a and 2b, a drain bonding bad 3 and a gate bonding pad 4 are provided on the GaAs substrate 1. On these pads, air bridges 5a, 5b, 5c and 5d are provided. These air bridges are respectively formed inside broken lines 8a, 8b, 8c and 8d and connected to the source bonding pads 2a and 2b, the drain bonding pad 3 and the gate bonding pad 4.

The air bridges 5a and 5b are connected by an air bridge 5 which extends therebetween. Hereinafter, the air bridges 5, 5a and 5b are denoted as a "first wire." That is, the source bonding pads 2a and 2b are connected to each other by the first wire that have an air bridge structure. Above the GaAs substrate 1, the first wire of the air bridge structure is thus extended at a certain distance from the component such as a transistor. In addition, each of the air bridges 5a and 5b has an opening 9 formed therethrough.

Figure 2:
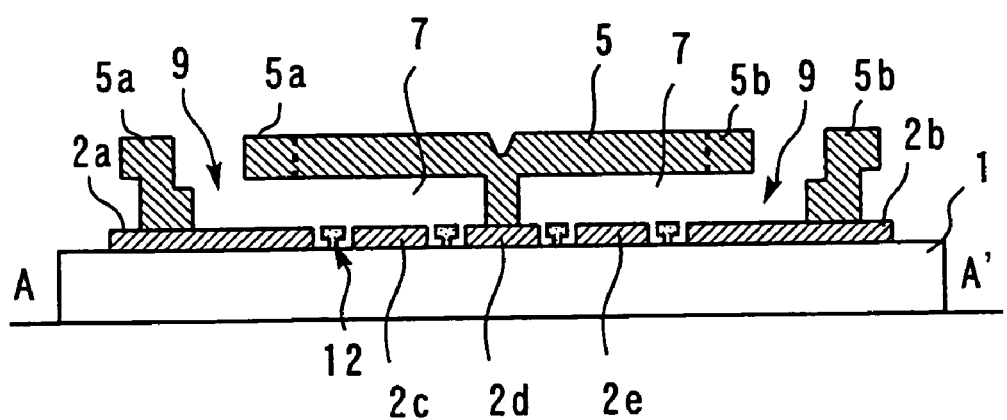

FIG. 2 shows a section along A-A' of FIG. 1. Between the source bonding pads 2a and 2b, metal electrodes 2c, 2d and 2e are formed on the GaAs substrate 1 at a certain interval. Further, respective gate electrodes 12 are formed between the source bonding pad 2a and the metal electrode 2c, between the metal electrodes 2c and 2d, between the metal electrodes 2d and 2e and between the metal electrode 2e and the source bonding pad 2b. On the source bonding pads 2a and 2b, the air bridges 5a and 5b are respectively formed. Above the metal electrodes 2c, 2d and 2e, the air bride 5 is extended from the metal electrode 2d. Each of the air bridge 5a and 5b has an opening 9 formed therethrough. Thus, a cavity 7 is formed between the air bridges 5, 5a and 5b and the gate electrodes 12.

Figure 3:
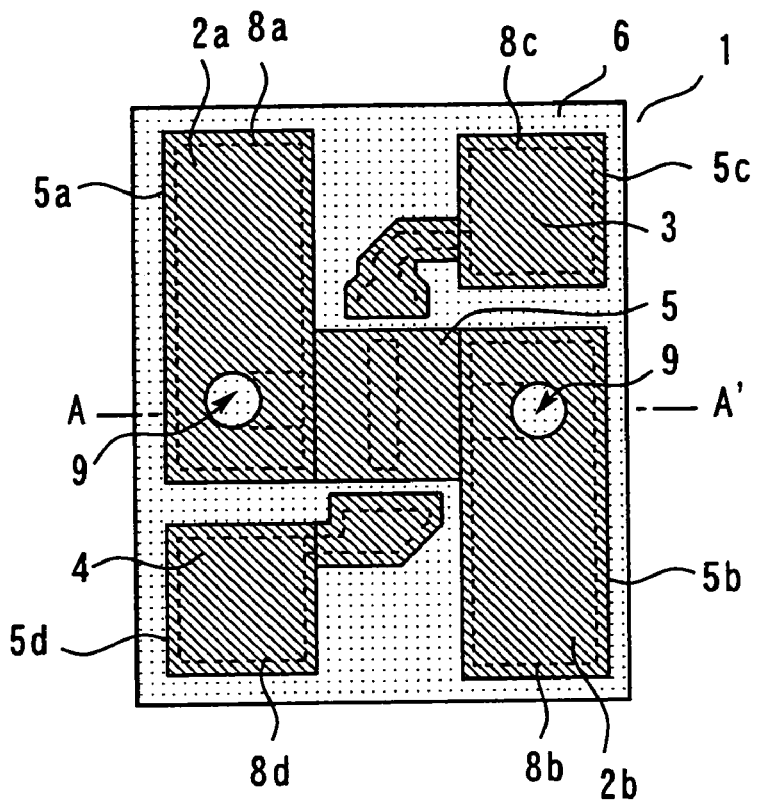
Figure 4:
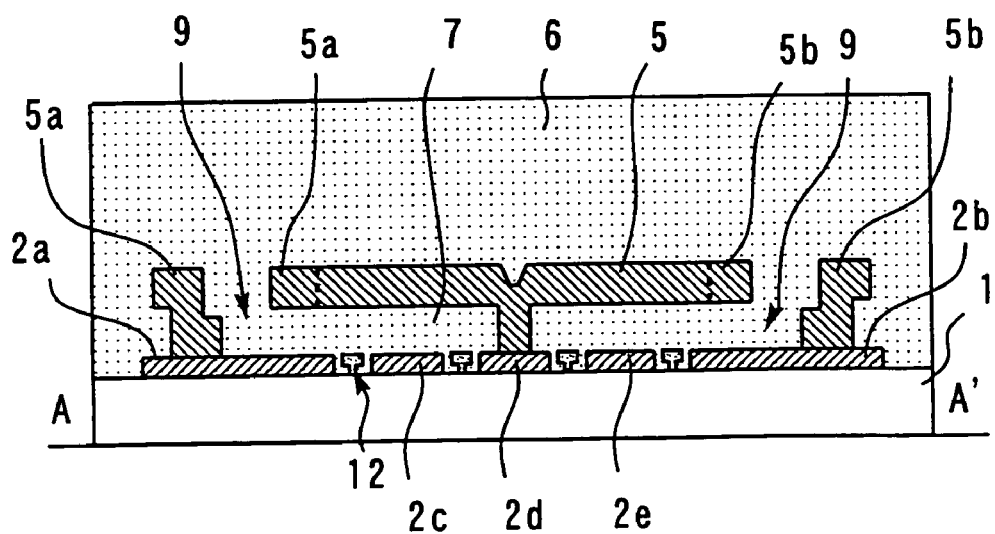

Then, the GaAs substrate 1 is wholly coated with a photosensitive polyimide film. FIG. 3 shows a top view of the semiconductor device with the polyimide film applied thereto. Likewise, FIG. 4 shows the cross section along A-A' of FIG. 3. As shown in FIG. 3, a polyimide film 6 is formed on the whole surface. In addition, the cavity 7 is filled up with the polyimide film 6.

Then, the top surface of the GaAs substrate 1 shown in FIGS. 3 and 4 is subjected to lithographic exposure so that a polyimide pattern to cover the top surface of the air bridge 5 will be formed so as to somewhat overlap the boundaries of the air bridge 5. At this time, the polyimide film 6 in the cavity 7 is not exposed due to the presence of the air bridges 5, 5a and 5b.

Then, the polyimide film 6 is developed. Consequently, a polyimide pattern 6a is formed which covers the top surface of the air bridge 5 so as to overlap the boundaries of the air bridge 5 (the ends of the polyimide pattern 6a are present outside the ends of the air bridge 5.)

Figure 5:
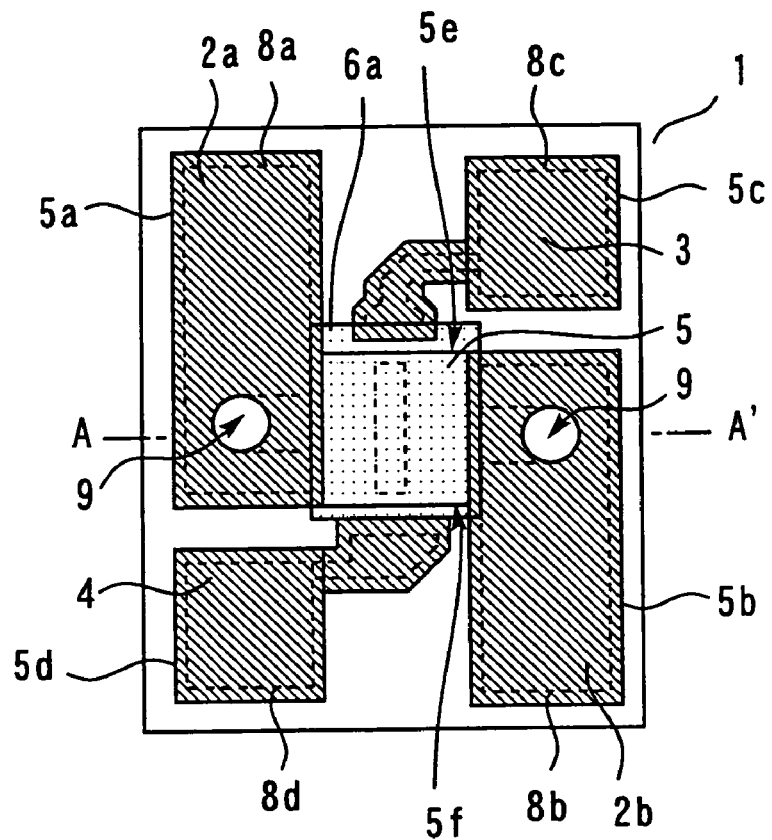
Figure 6:
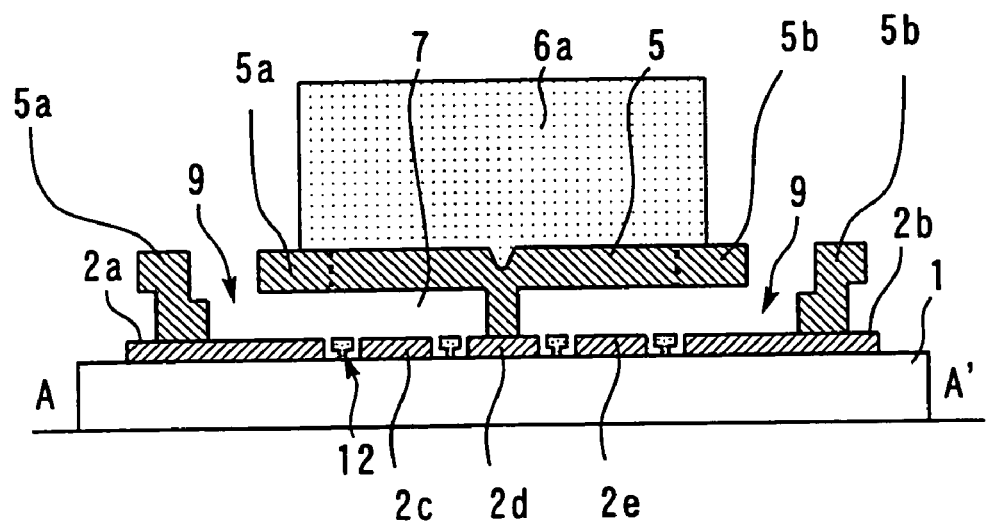

FIG. 6 shows the cross section along A-A' of FIG. 5. As shown in FIG. 6, the polyimide pattern 6a is formed on the air bridge 5. The polyimide film filled in the cavity 7, which was not exposed, is removed since it is pulled out from the openings 8 during the development.

The thus formed polyimide pattern 6a not only covers the top surface of the air bridge 5 but also constitutes walls which respectively extend from the ends 5e and 5f of the air bridge 5 to the surface of the GaAs substrate 1. It is therefore possible to seal the cavity 7 where the gate electrodes 12 are formed.

Figure 7:
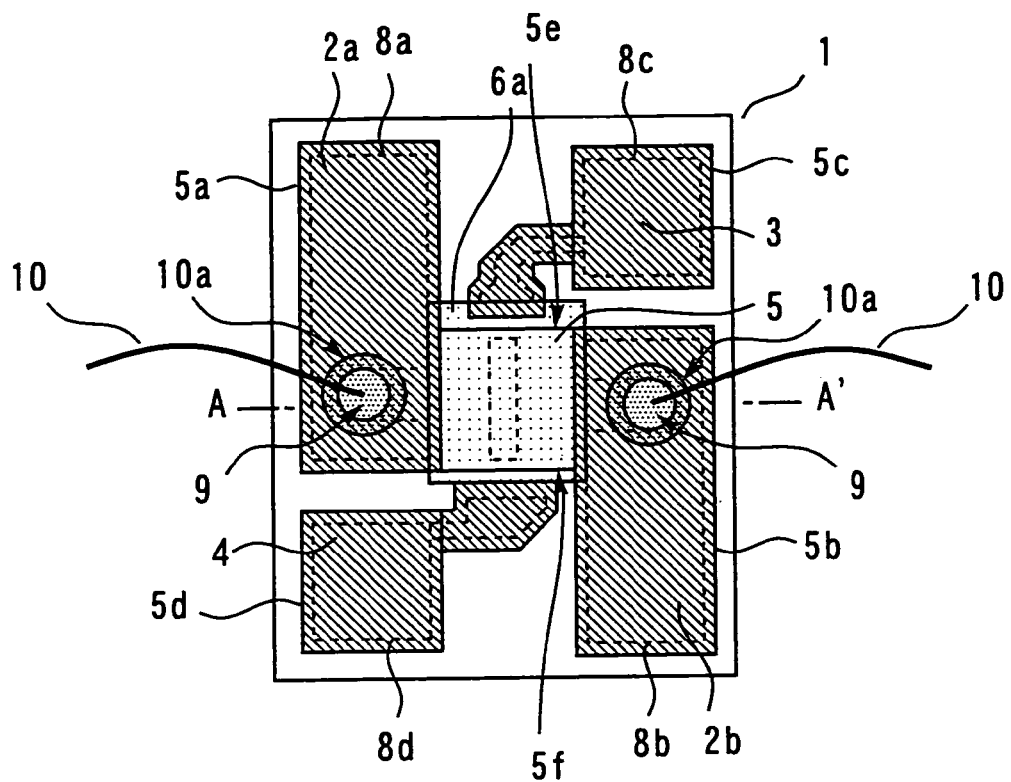

Then, a second wire 10 is formed by performing wire bonding so as to seal the openings 9 as shown in FIG. 7. The second wires 10 each have a front end formed with a ball 10a thereon. The balls 10a have a slightly larger diameter than the openings 9. With the balls 10a brought into contact respectively with the circumferences of the openings 9, wire bonding is performed.

Figure 8:
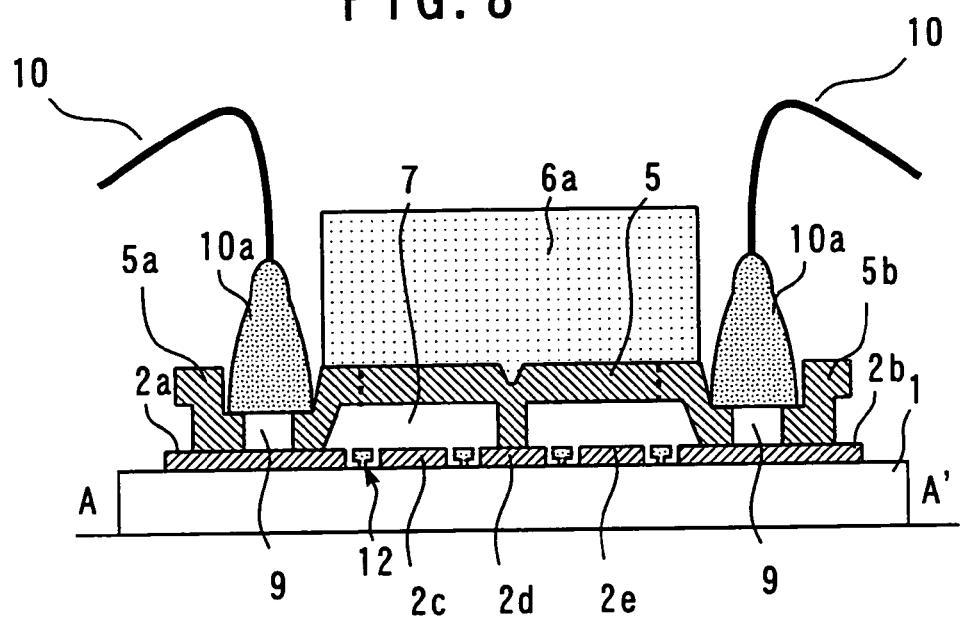

FIG. 8 shows the cross section along A-A' of FIG. 7. In this case, the balls 10a are brought into contact respectively with the air bridges 5a and 5b, portions of the air bridges 5a and 5b around the openings 9 are plastically deformed as shown in FIG. 8. The openings 9 are thus sealed by the balls 10a.

Then, the semiconductor device shown in FIG. 8 is set in a molding die or the like. There, a molding process is done with packaging the whole semiconductor device with molding resin. As a result, the sealing resin 31 is formed so as to wholly cover the first wire, the polyimide pattern 6a and the second wire 10. A semiconductor device in accordance with the present embodiment can be fabricated in this manner.

Figure 9:
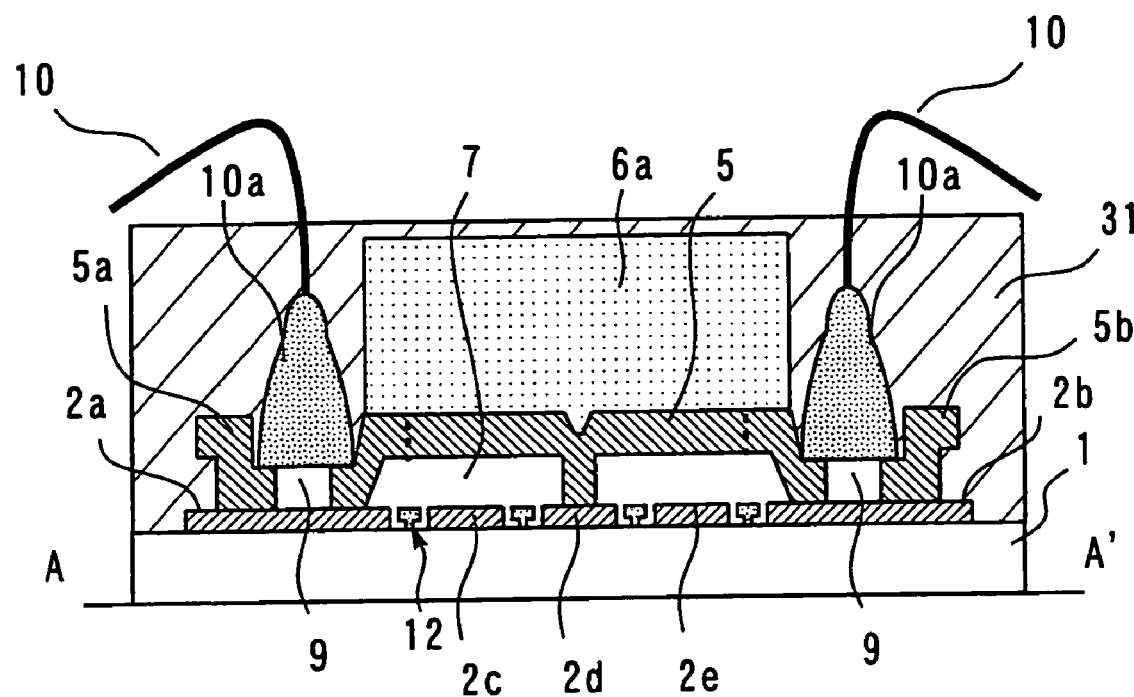

In the semiconductor device shown in FIG. 9, the gate electrodes 12 of the transistor used as a high frequency component is formed on the GaAs substrate 1. Above the GaAs substrate 1, the first wire (air bridges 5, 5a and 5b) is extended at a certain distance from the gate electrodes 12. The cavity 7 is formed between the gate electrodes 12 and the extended air bridge 5. From ends of the air bridge 5, the polyimide pattern 6a extends to the surface of the GaAs substrate 1 so as to seal the region where the gate electrodes 12 are provided. Each of the air bridges 5a and 5b has an opening 9 formed therethrough. These respective openings 9 are sealed by the front-end balls 10a of the second wire 10. Further, the air bridges 5, 5a and 5b (first wire) and the polyimide pattern 6a are all covered and sealed by the sealing resin 31.

The above-mentioned sealing resin 31 has a higher dielectric constant than the polyimide pattern 6a. The respective openings 9 are sealed by the balls 10a of the second wire 10 to prevent the sealing resin 31 from intruding into the cavity 7 during the molding. Therefore, it is possible to suppress an increase in capacitance parasitic to the high frequency component.

As mentioned above, the polyimide pattern 6a comprises a portion that is formed on the top surface of the air bridge 5, namely between the top surface of the air bridge 5 and the sealing resin 31. Preferably, the polyimide pattern 6a is an insulation film that has a higher mechanical strength than the sealing resin 31. This can prevent the air bridge 5 from deforming during the process of forming the sealing resin 31 (see FIG. 9).

An estimate was made how the above-mentioned structure is effective in suppressing an increase in parasitic capacitance. Given that the air has a relative dielectric constant of 1 while that of the sealing resin 31 is 4, a typical gate structure would has about four times larger parasitic capacitance if sealed by the resin. In practice, however, the intrinsic capacitance of the transistor-formed region also has influence on its high frequency characteristics. Accordingly, the finite element method was used to estimate the effect of the present invention relative to the total gate capacitance.

The model used in this calculation is a high electron mobility transistor (HEMT) having a mushroom-shaped gate structure wherein the gate length is 0.2 μm, the source-drain distance is 3 μm, the source-gate distance is 1 μm, the gate metal thickness is 0.6 μm, the electron supply layer thickness is 20 nm and the gate height is 0.26 μm. The calculation result shows that the gate capacitance per unit gate width is 1.6894 fF/μm if the transistor-formed region is covered with sealing resin. In the case of the present semiconductor device embodiment, this gate capacitance is 1.3863 fF/μm. By employing the structure of the present embodiment, it is therefore possible to decrease the gate capacitance per unit gate width by about 18%.

In addition, distorted lattice high mobility field effect transistors were experimentally fabricated by using the manufacturing method of the present embodiment and MSG (Maximum Stable Gain) evaluation was made at a frequency of 12 GHz. As a result, whereas a conventional sample in which the component region is covered by injected sealing resin showed a MSG of 12.5 dB, a sample fabricated according to the present embodiment showed a MSG value of 13.8 dB. It is therefore possible to attain a MSG improvement of about 1.3 dB by employing the structure shown in the present embodiment.

The following describes a variation of the semiconductor device fabrication method in accordance with the present embodiment. In this variation, the openings 9 are formed so as to have substantially the same diameter as the balls 10a. The wire bonding process inserts the balls into the openings 9. The openings 9 are sealed without plastically deforming the air bridges 5a-5d around the openings 9.

Figure 10:
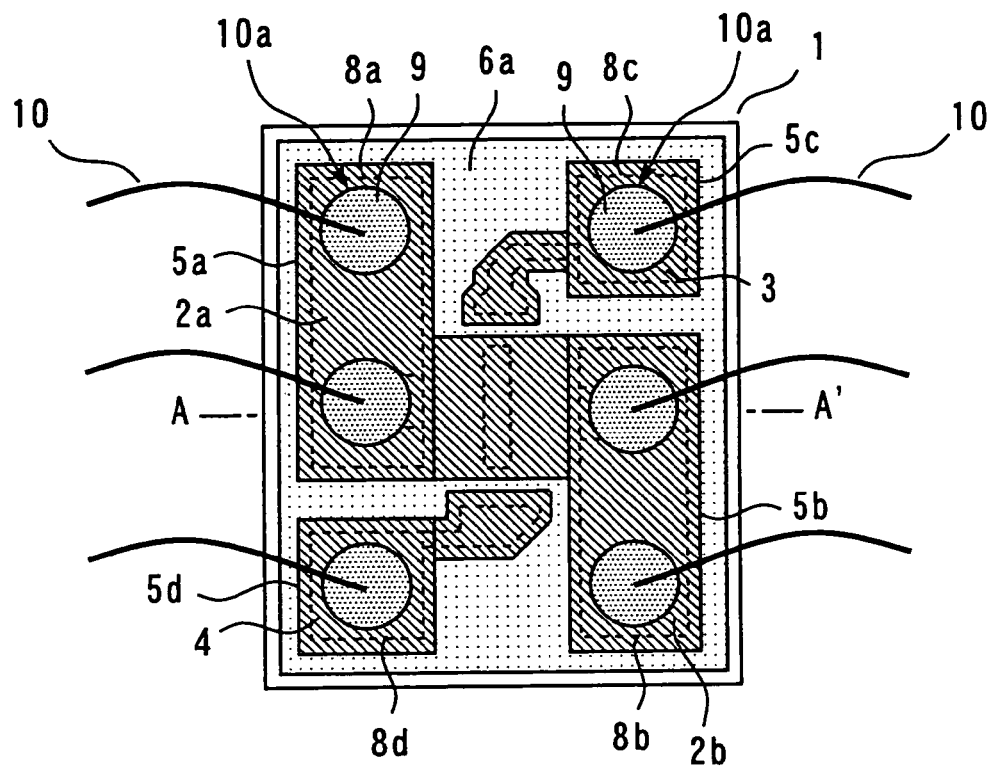
Figure 11:
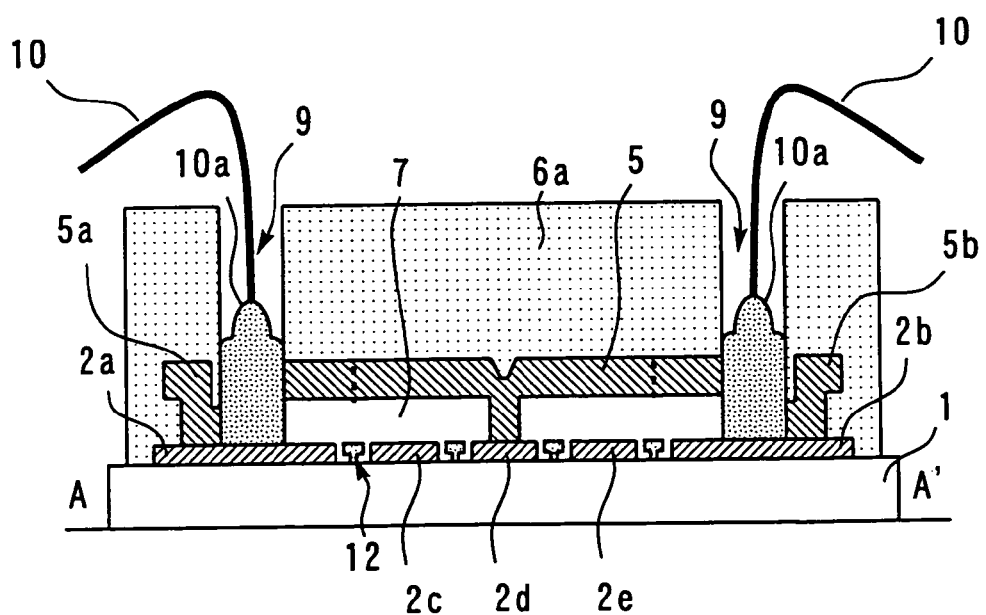

FIG. 11 shows the cross section along A-A of FIG. 10. As shown in FIG. 11, the balls 10a are inserted through the openings 9. Their bottoms are in contact with the top surfaces of the source bonding pads 2a and 2b. Thus, the openings 9 are sealed by the balls 10a.

A description of the other processes is omitted here since they are the same as the aforementioned manufacturing method (refer to FIGS. 1 through 9) of the present embodiment. This variation can also attain the same effect as the semiconductor device shown in FIG. 9.

Second Embodiment

The following describes a method of manufacturing a semiconductor device in accordance with this embodiment. A description of the present embodiment focuses on what are different from the second embodiment. Firstly, a transistor and other components are formed on a GaAs substrate 1. This and the subsequent processes are done in the same manner as the first embodiment until the first wire is formed although they are not illustrated.

Figure 12:
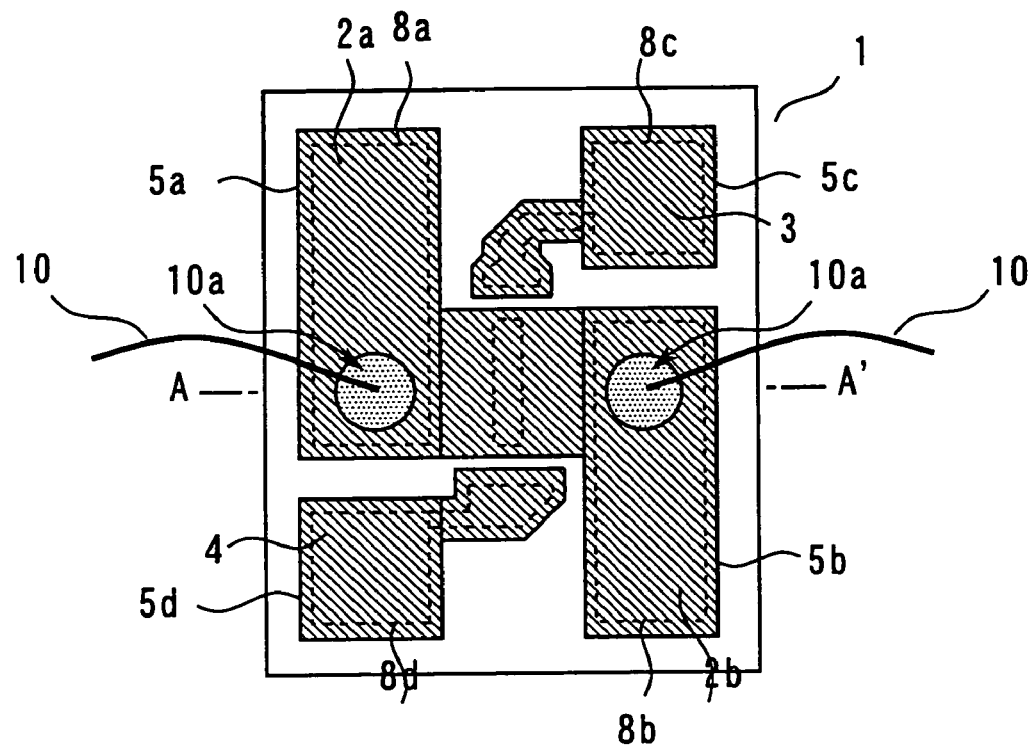
FIGS. 12 through 15 show a method of a manufacturing of a semiconductor device of the second embodiment.
Figure 13:
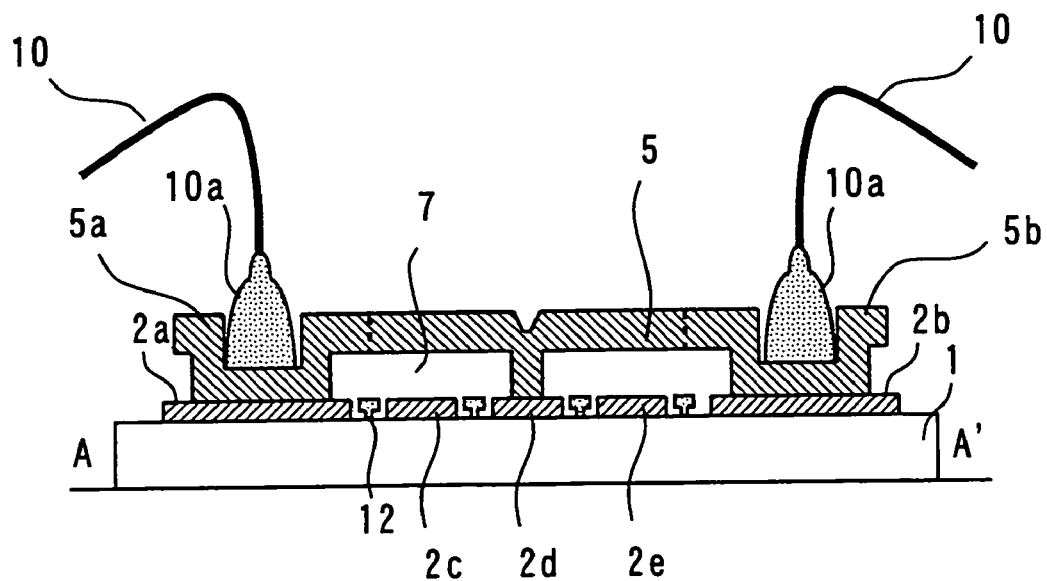

Then, wire bonding is done onto source bonding pads 2a and 2b as shown in FIG. 12. FIG. 13 shows the cross section along A-A' of FIG. 12. Parts of air bridges 5a and 5b are respectively connected to the source bonding pads 2a and 2b as they are plastically deformed.

Figure 14:
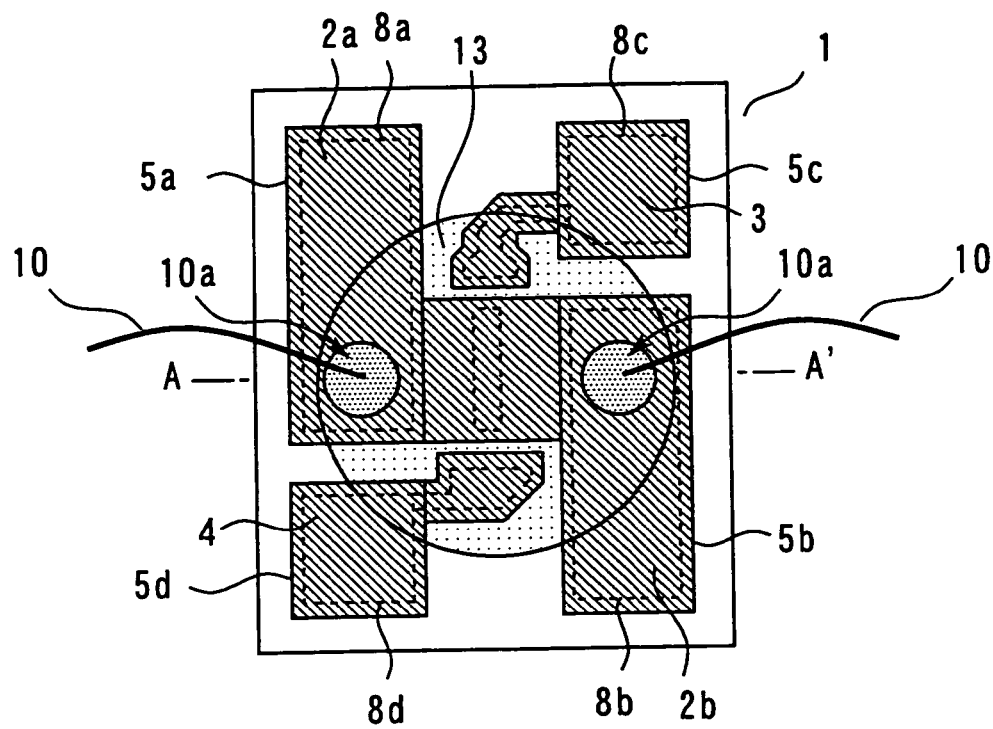

Then, as shown in FIG. 14, a potting material 13 is dropped so as to surround the gate electrodes (not shown in the figure) at a distance. For example, the potting material 13 uses a low fluidity material having a relative dielectric constant of 3 or lower. In this case, an insulation film, whose relative dielectric constant is lower than that of the sealing resin used for the packaging, should be used.

Figure 15:
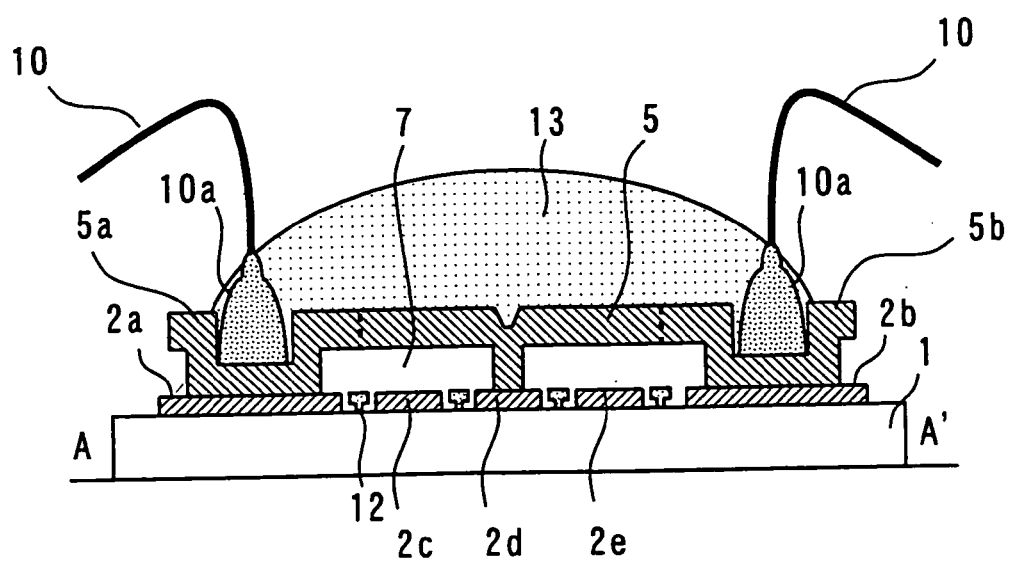

FIG. 15 shows the cross section along A-A of FIG. 14. The dropped potting material 13 seals the cavity 7 as an airtight room. Its internal pressure rises to balance with the outer pressure. Extending from ends of the air bridge 5 to the surface of the GaAs substrate 1, the thus dropped potting material 13 seals the region where the gate electrodes 12 of the transistor are formed.

In the present embodiment, no opening is formed in the first wire. Instead, bonding is done by plastically deforming the air bridges 2a and 2b as shown in FIG. 13 and then the potting material 13 is dropped. This method can eliminate the process of forming openings in the first wire. In addition, the lithography process (exposure and development) to form such a polyimide pattern 6a as in the first embodiment can be eliminated.

Then, similar to the first embodiment, sealing resin is molded so as to cover the whole surface of the GaAs substrate 1.

In the semiconductor device manufacturing method according to the present embodiment, the potting material 13 is used instead of forming the polyimide pattern 6a of the first embodiment (see FIGS. 5 and 6). The potting material 13 has a lower dielectric constant than the sealing resin. Therefore in this structure, since the top surface of the air bridge 5 is covered by an insulation film whose dielectric constant is lower than that of the sealing resin, an increase in capacitance parasitic to the high frequency component can be suppressed more effectively than in the first embodiment.

In the present embodiment, the process to form openings in the first wire is eliminated. This can reduce the number of the process steps as compared with the first embodiment. In addition, since the air tightness of the cavity 7 can be improved, it is possible to effectively prevent the sealing resin 31 from intruding into the cavity 7 when the sealing resin is molded.

In a semiconductor device fabricated by the aforementioned manufacturing method, the potting material 13 is dropped so as to extend from ends of the air bridge 5 to the surface of the GaAs substrate 1, namely, seal the region where the gate electrodes 12 of the transistor are formed. In addition, the first wire has no opening formed therethrough. Such a structure makes it possible to effectively prevent the sealing resin 31 from intruding into the cavity 7 when the sealing resin is molded. Therefore, the increase in parasitic capacitance can be suppressed more effectively than in the first embodiment.

Third Embodiment

Figure 16:
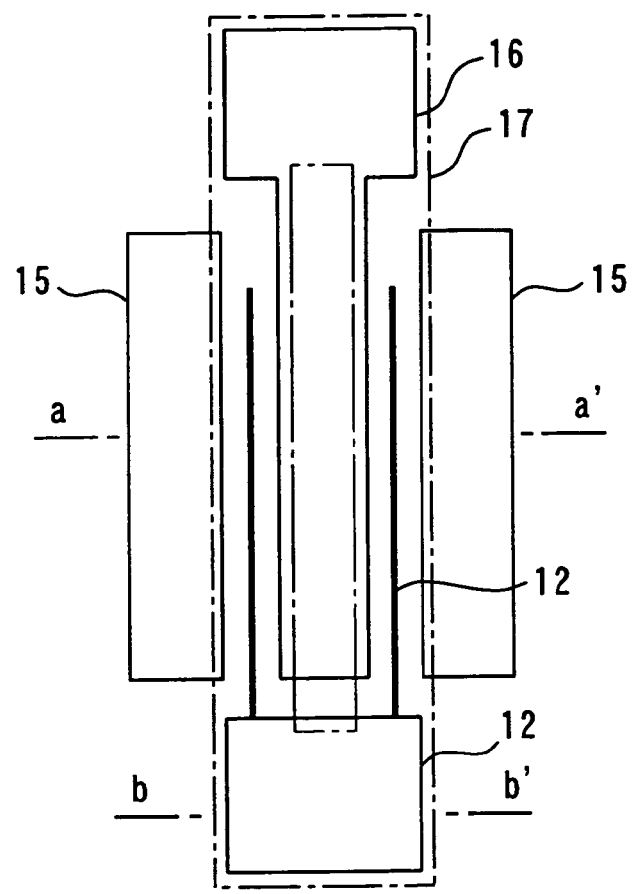
FIGS. 16 through 27 show a method of a manufacturing of a semiconductor device of the second embodiment.

The following describes a method of manufacturing a semiconductor device in accordance with this embodiment. A description of the present embodiment focuses on what are different from the first and second embodiments. At first, a field effect transistor (hereinafter denoted as the "FET") having gate electrodes 12, source electrodes 15 and a drain electrode 16 is formed on a GaAs substrate as shown in FIG. 16. Each gate electrode 12 is faced to one source electrode 15 and the drain electrode 16. Then, a first resist pattern 17 is formed on the FET so as to cover the active region between one source electrode 15 and the drain electrode 16 and the active region between the other source electrode 15 and the drain electrode 16. The regions covered by the first resist pattern 17 are indicated by dashed-dotted lines.

Figure 17:
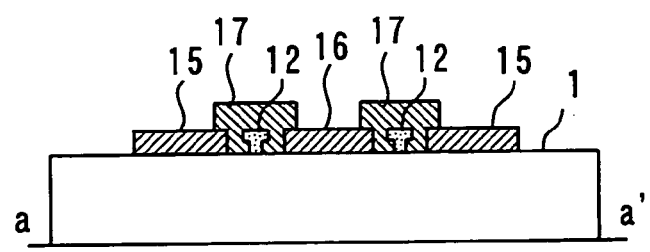

FIG. 17 shows the cross section along a-a' of FIG. 16. On the GaAs substrate 1, the source electrodes 15 and the drain electrode 16 are formed. Each of the gate electrodes 12 is formed between them. The first resist pattern 17 is formed so as to cover the gate electrodes 12 and the active regions exposed beside them.

Figure 18:
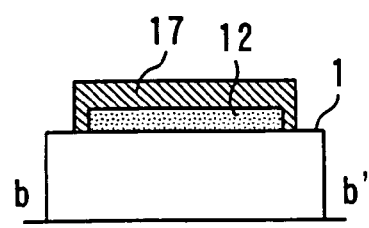

FIG. 18 shows the cross section along b-b' of FIG. 16. On the GaAs substrate 1, the gate electrode 12 is formed. The first resist pattern 17 is formed so as to cover the gate electrode 12.

Then, a polyimide film and a photoresist film are formed over the FET in this order although they are not shown in the figure. Then, the photoresist film is exposed so that a second resist pattern 19 (indicated by dotted lines) will be left over the first resist pattern 17.

Then, by using the second resist pattern 19 as a mask, the polyimide film is etched down to the first resist pattern 17 (see FIGS. 17 and 18) in order to form openings above the gate electrode 12, the source electrodes 15 and the drain electrode 16. Further, the second resist pattern 19 is removed by using an organic solvent. At this time, the organic solvent can intrude through the openings to remove the first resist pattern 17 (see FIGS. 17 and 18).

Figure 19:
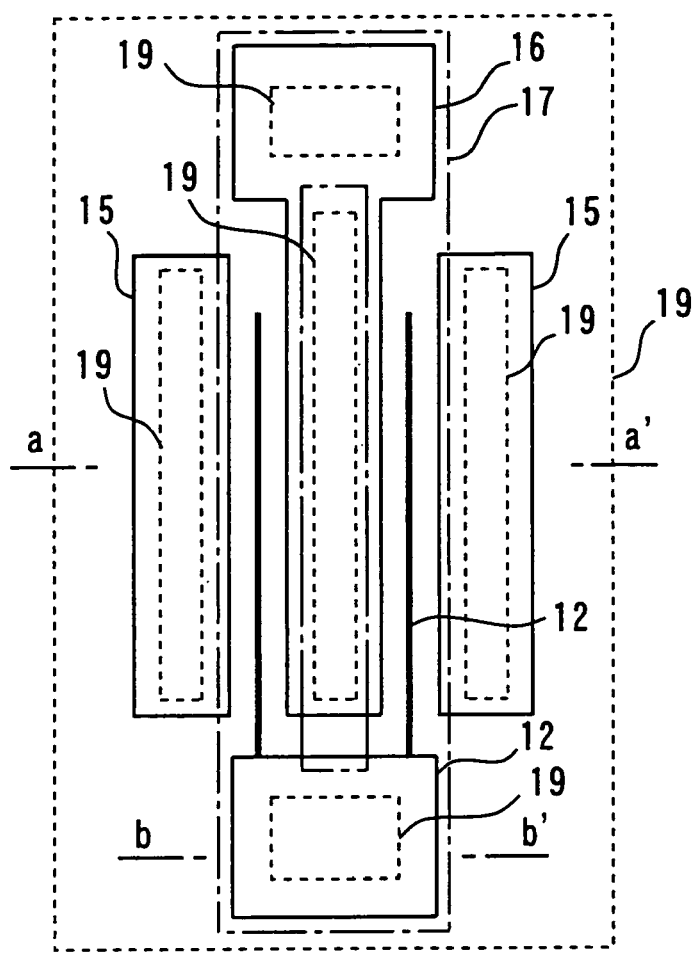
Figure 20:
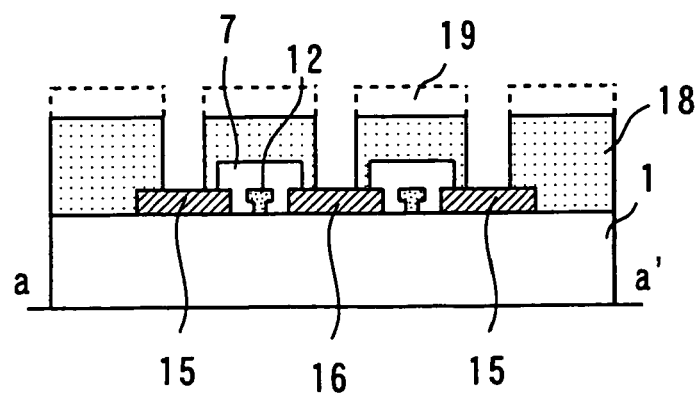
Figure 21:
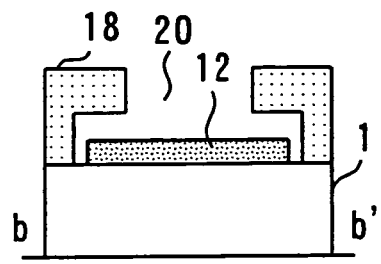

FIG. 20 shows the cross section of a-a' of FIG. 19 after the second resist pattern 19 and the second resist pattern 17 are removed. Likewise, FIG. 21 shows the cross section of b-b' of FIG. 19. As shown in FIG. 20, a polyimide pattern 18 is formed on the GaAs substrate 1. A cavity 7 is formed between the polyimide pattern 18 and the gate electrode 12. In addition, as shown in FIG. 21, an opening 20 is formed on the gate electrode 12.

Figure 22:
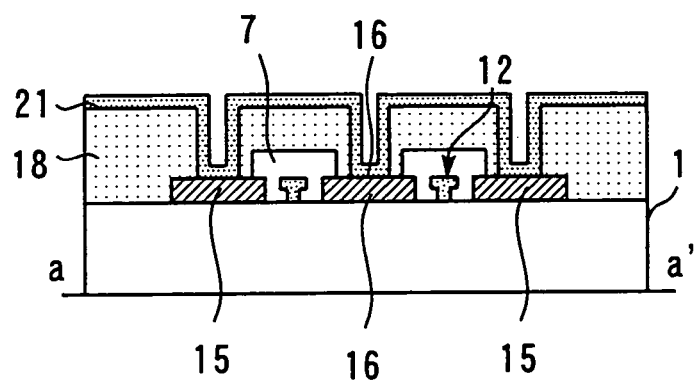
Figure 23:
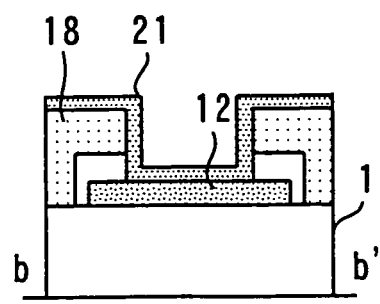

Then, a metal film is deposited to an appropriate thickness over the polyimide pattern 18 by sputtering or the like. FIG. 22 shows the resulting cross section along a-a' of FIG. 19. As shown, a metal film 21 is formed so as to bury the concaves of the polyimide pattern 18. Likewise, FIG. 23 shows the resulting cross section along b-b' of FIG. 19. As shown, the metal film 21 is formed so as to bury the opening 20 (see FIG. 21).

Figure 24:
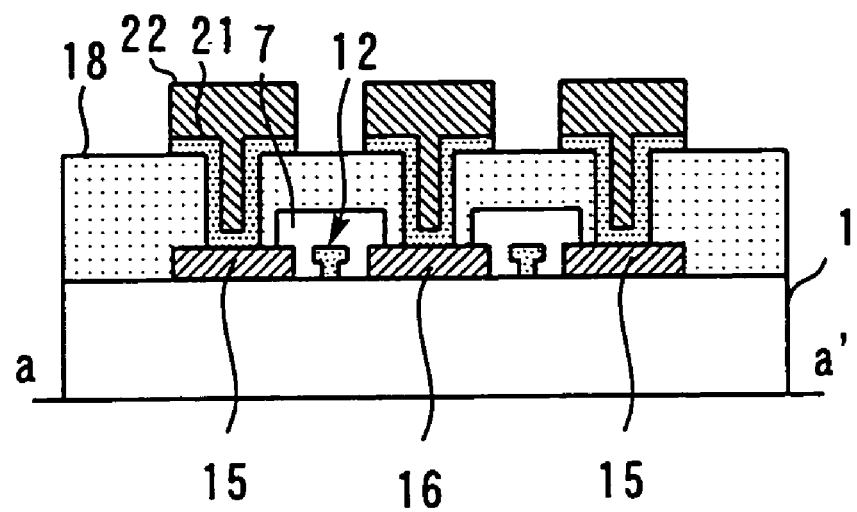

Then, a resist pattern (not shown in the figure) is formed over the metal film 21 shown in FIGS. 22 and 23. Through this resist pattern, an electrolytic plating is done to form a plated wire by using the metal film 21 as the anode layer. After that, the resist pattern is removed by an organic solvent or the like and the metal film 21 is selectively etched by the ion milling method or the like. FIG. 24 shows the resulting cross section along a-a' of FIG. 19. As shown, a plated wire 22 is formed over the metal film 21. The metal wire (metal film 21 and plated wire 22) is thus formed so as to fill up the respective concaves present above the source electrodes 15 and drain electrode 16.

Figure 25:
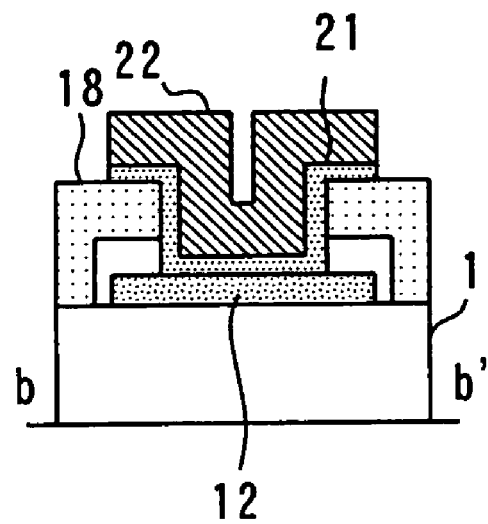

Likewise, FIG. 25 shows the resulting cross section along b-b' of FIG. 19. As shown, the plated wire 22 is formed over the metal film 21. The metal wire (metal film 21 and plated wire 22) are thus formed so as to fill up the concave above the gate electrode 12.

Then, similar to the first and second embodiments, sealing resin is molded on the GaAs substrate 1 although not illustrated. Since the opening 20 (see FIG. 21) formed above the gate electrode 12 is filled up with the metal film 21 and plated wire 22, it is possible to prevent the high dielectric constant sealing resin from intruding into the active areas of the high frequency component during the molding.

Figure 26:
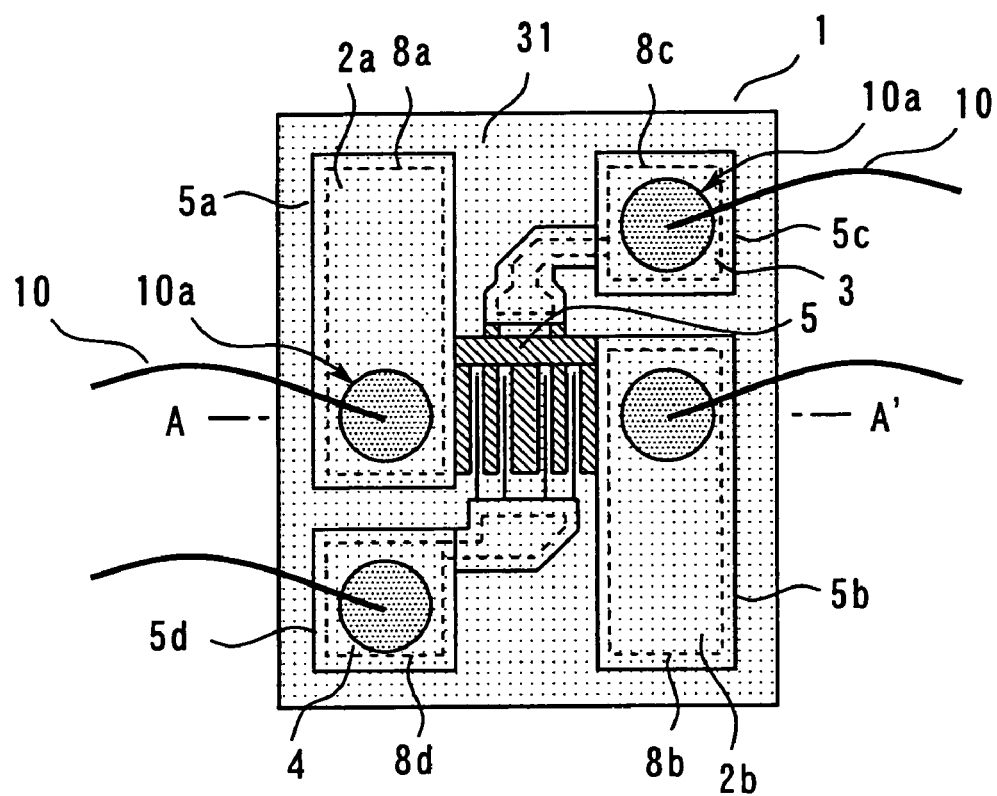
Figure 27:
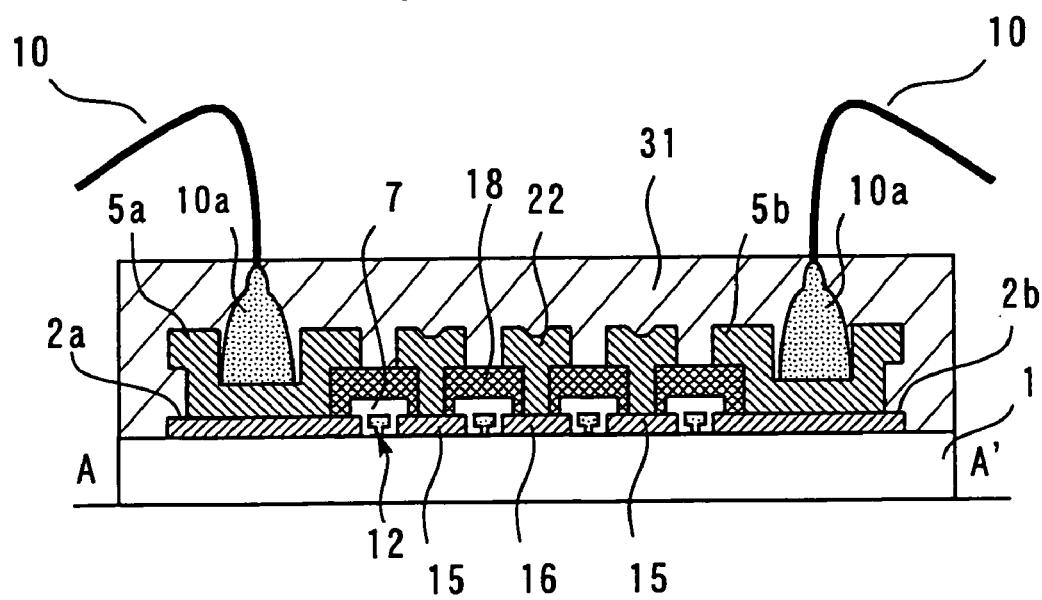

By the manufacturing method describe above, a semiconductor device shown in FIG. 26 (top view) is obtained. FIG. 27 shows the cross section along A-A' of FIG. 26. In this structure, the gate electrodes 12 of the high frequency transistor, formed on the GaAs substrate 1, is sealed by the polyimide pattern 18 via the cavities 7. Although the polyimide pattern 18 has the opening 20 (see FIG. 21), this opening is closed by the metal film 21 (see FIG. 25) and plated wire 22.

This structure can prevent the sealing resin from intruding into the cavities 7 above the gate electrodes 7. It is therefore possible to suppress an increase in capacitance parasitic to a high frequency component.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2005-342199, filed on Nov. 28, 2005 including specification, claims, drawings and summary, on which the Convention priority of the present application is based, are incorporated herein by reference in its entirety.

The invention claimed is:

1. A semiconductor device comprising:
   a component located on a substrate;
   a first wire of an air bridge structure extending above the substrate at a distance from the component;
   a first insulating film which encloses space between the first wire and an area where the component is located on the substrate; and
   a sealing material which covers the first wire and the first insulating film, wherein the first wire has openings and the openings are sealed by a second wire.

2. The semiconductor device according to claim 1, including a second insulating film which has a larger mechanical strength than the first wire and is located between the first wire and the sealing material.

3. A semiconductor device comprising:
   a substrate;
   a component located on the substrate;
   an air bridge structure including a first wire with opposed top and bottom surfaces that extend to and are defined by edges of the first wire, the first wire, including the edges, being disposed above and spaced from the substrate by an air gap, at a distance from the component, with the bottom surface, including the edges, of the wire facing and separated from the substrate by the air gap;
   an insulating film covering all of the top surface of the first wire, extending beyond the edges of the first wire, closing the air gap and contacting the substrate, and enclosing space between the bottom surface of the first wire and the component located on the substrate; and
   a sealing material which covers the first wire and the insulating film, wherein, the relative dielectric constant of the insulating film is lower than the relative dielectric constant of the sealing material.

4. A method of manufacturing a semiconductor device comprising:
   forming a component on a substrate;
   forming a first wire of an air bridge structure extending above the substrate at a distance from the component;
   forming openings in the first wire;
   forming an insulating film enclosing space between the first wire and an area where the component is located on the substrate;
   forming a second wire sealing the openings; and
   molding a sealing material covering the first wire and the insulating film.

5. A method of manufacturing a semiconductor device comprising:
   forming a component on a substrate;
   forming a first wire of an air bridge structure extending above the substrate at a distance from the component;
   after forming the first wire, forming an insulating film enclosing space between the first wire and an area where the component is located on the substrate; and
   molding a sealing material covering the first wire and the insulating film, wherein the relative dielectric constant of the sealing material is higher than the relative dielectric constant of the insulating film.

* * * * *